(12) United States Patent
Citrin et al.

(10) Patent No.: US 6,403,454 B1
(45) Date of Patent: Jun. 11, 2002

(54) SILICON SEMICONDUCTOR DEVICES WITH δ-DOPED LAYERS

(75) Inventors: Paul H. Citrin, Westfield; Hans-Joachim Ludwig Gossmann, Summit; David Anthony Muller, Basking Ridge, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/430,316

(22) Filed: Oct. 29, 1999

(51) Int. Cl.$^7$ .................. H01L 21/04; H01L 21/261; H01L 21/425
(52) U.S. Cl. .................. 438/514; 438/510; 438/511; 438/512; 438/516
(58) Field of Search ................. 438/510, 511, 438/512, 513, 514, 515, 516

(56) References Cited

U.S. PATENT DOCUMENTS

| | | | | | |
|---|---|---|---|---|---|
| 4,088,799 A | * | 5/1978 | Kurtin | .................. | 427/38 |
| 4,135,951 A | * | 1/1979 | Stone | .................. | 148/1.5 |
| 4,767,494 A | * | 8/1988 | Kobayashi et al. | .......... | 156/606 |
| 5,379,719 A | * | 1/1995 | Chalmers et al. | ............. | 117/89 |
| 5,656,859 A | * | 8/1997 | Murakoshi et al. | .......... | 257/750 |
| 5,770,512 A | * | 6/1998 | Murakoshi et al. | .......... | 438/520 |
| 5,846,867 A | * | 12/1998 | Gomi et al. | ................ | 438/318 |
| 5,888,886 A | * | 3/1999 | Sverdlov et al. | ............ | 438/505 |
| 5,902,393 A | * | 5/1999 | Nido et al. | ................... | 117/2 |
| 5,989,986 A | * | 11/1999 | Hsieh | ................... | 438/514 |
| 6,261,857 B1 | * | 7/2001 | Alam et al. | .................. | 438/31 |
| 6,323,528 B1 | * | 11/2001 | Yamazaki et al. | .......... | 257/411 |

FOREIGN PATENT DOCUMENTS

EP          0324044 A1 * 7/1989 ..................... 39/22

OTHER PUBLICATIONS

Chadi et al., Fermi–Level–Pinning Defects in Highly n–Doped Silicon, Phys. Rev. Lett., vol. 79, No. 24, pp. 4834–4837 (Dec. 1997).

Gossmann et al., Dopant electrical activity and majority –carrier mobility in B–and Sb–δ–doped Si thin films, Phys. Rev. B, vol. 47, No. 19, pp. 12618–12624 (May 1993).

Slijkerman et al., X–ray reflectivity of an Sb–delta–doping layer in silicon, J. Appl. Phys., vol. 68, No. 10, pp. 5105–5108 (Nov. 1990).

Powell et al., Elemental boron and antimony doping of MBE Si and SiGe structures grown at temperature below 600° C., J. Crystal Growth, vol. 111, pp. 907–911 (1991).

Bass, Silicon and Germanium Doping of Epitaxial Gallium Arsenide Grown by the Trimethylgallium–Arsine Method, J. Crystal Growth, vol. 47, pp. 613–618 (1979).

* cited by examiner

Primary Examiner—Matthew Smith
Assistant Examiner—Chuong A. Luu
(74) Attorney, Agent, or Firm—Michael J. Urbano

(57) ABSTRACT

We have discovered that, contrary to conventional wisdom about forming DP defects, electrical saturation in highly doped 2D layers of Si does not occur. In accordance with one aspect of our invention, free-carrier concentrations in excess of about $7 \times 10^{20}$ cm$^{-3}$ can be attained in single crystal Si layers δ-doped with a Group V element. In one embodiment, free-carrier concentrations in excess of about $2 \times 10^{21}$ cm$^{-3}$ are realized in single crystal Si that is δ-doped with Sb. In another embodiment, the δ-doped layer is formed as an integral part of an FET. In accordance with another aspect of our invention, an integrated circuit is fabricated by the steps of providing a single crystal silicon body and forming a doped layer in the body, characterized in that the processing steps form neither a significant amount of electrically inactive precipitates nor a significant number of deactivating dopant centers containing vacancies, and the layer is fabricated as a δ-doped layer that is doped with a Group V element, so that the free-carrier density in the layer is in excess of about $7 \times 10^{20}$ cm$^{-3}$, preferably in excess of about $2 \times 10^{21}$ cm$^{-3}$.

5 Claims, 5 Drawing Sheets

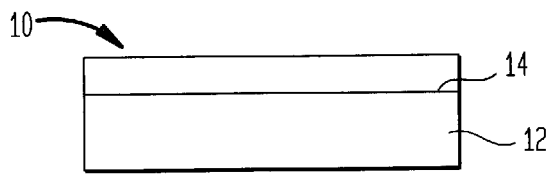
FIG. 1
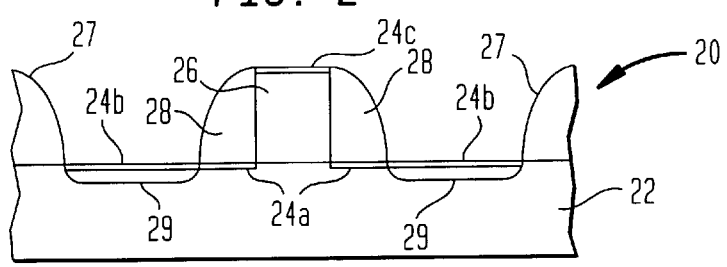
FIG. 2
FIG. 3
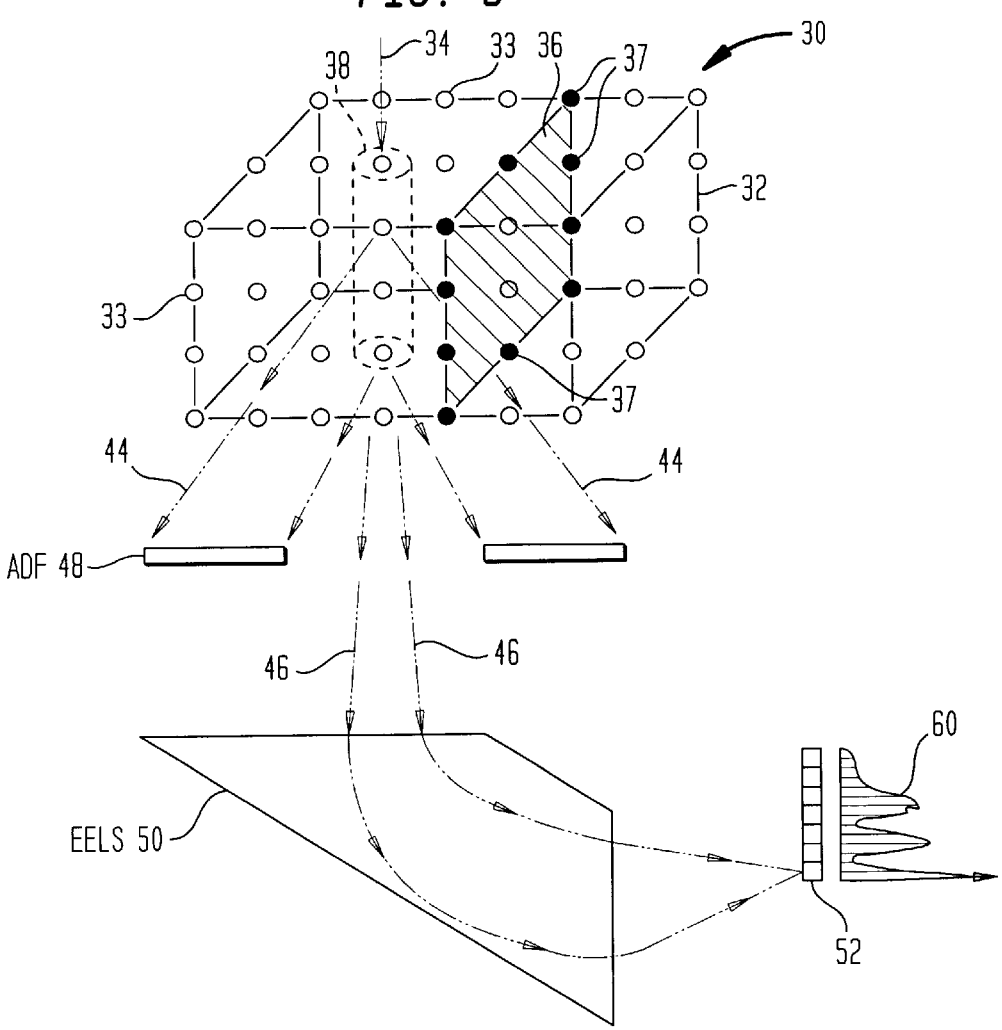

SILICON SEMICONDUCTOR DEVICES WITH δ-DOPED LAYERS

FILED OF THE INVENTION

This invention relates generally to silicon (Si) semiconductor devices having δ-doped layers and, more particularly, to integrated circuits incorporating such devices.

BACKGROUND OF THE INVENTION

In semiconductor devices grown by techniques that allow for a high degree of control of layer thickness and dopant concentration (e.g., molecular beam epitaxy or MBE) it is known to form extremely thin layers that have very high levels of dopant concentration (e.g., concentrations in excess of $10^{20}$ $cm^{-3}$). Thin highly doped layers of this type are known as delta-doped or δ-doped layers. Their thickness is so small, relative to a characteristic length of the material (e.g., a Debye length), that these layers are also referred to as two-dimensional (2D) layers, as contrasted with much thicker layers that are known as three-dimensional (3D) layers.

The dopant concentration and the free-carrier concentration (or density), however, are typically not the same. As the dopant concentration increases, it is well known that the free-carrier concentration will eventually saturate. This behavior in Si has been attributed to the formation of electrically inactive precipitates and/or deactivating dopant centers containing vacancies. Recently, a new class of deactivating defects in Si without vacancies, called donor pairs (DP), has been proposed to explain the observed electrical saturation. See, D. J. Chadi et al., *Phys. Rev. Lett.*, Vol. 79, No. 24, p. 4834 (1997), which is co-authored by two of us (P. H. Citrin and H-J. Gossmann) and is incorporated herein by reference. Formation of DP defects depends only on dopant concentration rather than on sample preparation conditions, so even if preparation is adjusted to avoid precipitates or vacancy-containing centers, electrical saturation will still occur. Chadi et al. at page 4837, col. 1, reported that the free-carrier concentration saturated at a maximum of about $6.5 \times 10^{20}$ $cm^{-3}$ and concluded that DP defects represent an inherent limitation to electron activity of Si doped with group V donors.

Such a barrier to achieving full electrical activity in highly doped Si should be particularly severe for 2D δ-doped layers, where even higher dopant densities can, in principle, be obtained. See, S. J. Bass, *J. Cryst. Growth*, Vol. 47, p.613 (1979), which is incorporated herein by reference. Free-carrier areal concentrations ($n_e$) of up to about $3 \times 10^{14}$ $cm^{-2}$ have been reported in 2D layers (See, H.-J. Gossmann et al., *Phys. Rev.*, Vol. 47, No. 19, p. 12618 (1993), which is incorporated herein by reference.), but because the δ-doped layer thicknesses in those samples were not determined, the effective volume concentration of dopants was not known. Conversely, samples from which reliably measured δ-doped layer thicknesses were reported had no corresponding measurements of electrical activity. See, W. F. J. Slijkerman et al., *J. Appl. Phys.*, Vol. 68, No. 10, p. 5105 (1990) and A. R. Powell et al., *J. Cryst. Growth*, Vol. 111, p. 907 (1991), which are incorporated herein by reference. Consequently, the importance of DP defects in 2D δ-doped Si layers, and thus the inherent limitations on free-carrier densities, in general, has heretofore not been possible to assess accurately.

SUMMARY OF THE INVENTION

We have discovered that, contrary to conventional wisdom about forming DP defects, electrical saturation in highly doped 2D layers of Si does not occur. In accordance with one aspect of our invention, free-carrier concentrations in excess of about $7 \times 10^{20}$ $cm^{-3}$ can be attained in single crystal Si layers δ-doped with a Group V element. In one embodiment, free-carrier concentrations in excess of about $2 \times 10^{21}$ $cm^{-3}$ are realized in single crystal Si that is δ-doped with Sb. In another embodiment, the δ-doped layer is an integral part of an FET; e.g., it may be located under the spacers, near the top of the source drain regions, and/or near the top of the gate stack. In accordance with another aspect of our invention, an integrated circuit is fabricated by the steps of providing a single crystal silicon body and forming a doped layer in the body, characterized in that the processing steps form neither a significant amount of electrically inactive precipitates nor a significant number of deactivating dopant centers containing vacancies, and the layer is fabricated as a δ-doped layer that is doped with a Group V element, so that the free-carrier density in the layer is in excess of about $7 \times 10^{20}$ $cm^{-3}$, preferably in excess of about $2 \times 10^{21}$ $cm^{-3}$.

BRIEF DESCRIPTION OF THE DRAWING

Our invention, together with its various features and advantages, can be readily understood from the following more detailed description taken in conjunction with the accompanying drawing, in which:

FIG. 1 is a schematic view of a Si device in accordance with one embodiment of our invention, the device may be discrete or part of an integrated circuit (IC);

FIG. 2 is a schematic view of a FET in accordance with another embodiment of our invention;

FIG. 3 is a schematic view of apparatus used to measure the thickness of δ-doped layers;

FIG. 6 is an annular dark field (ADF) image for the 2D sample labeled δ-5 in FIG. 5. The Sb atoms appear as a bright band because they scatter electrons more strongly than Si atoms. FIG. 7 is a graph of the electron energy loss spectroscopy (EELS) signal for the Sb $M_{4,5}$ edge recorded across the same 2D δ-doped layer simultaneously with the ADF signal. The approximately 500 A-thick sample contains fewer than about 15 Sb atoms in the electron beam path;

Figure 4:
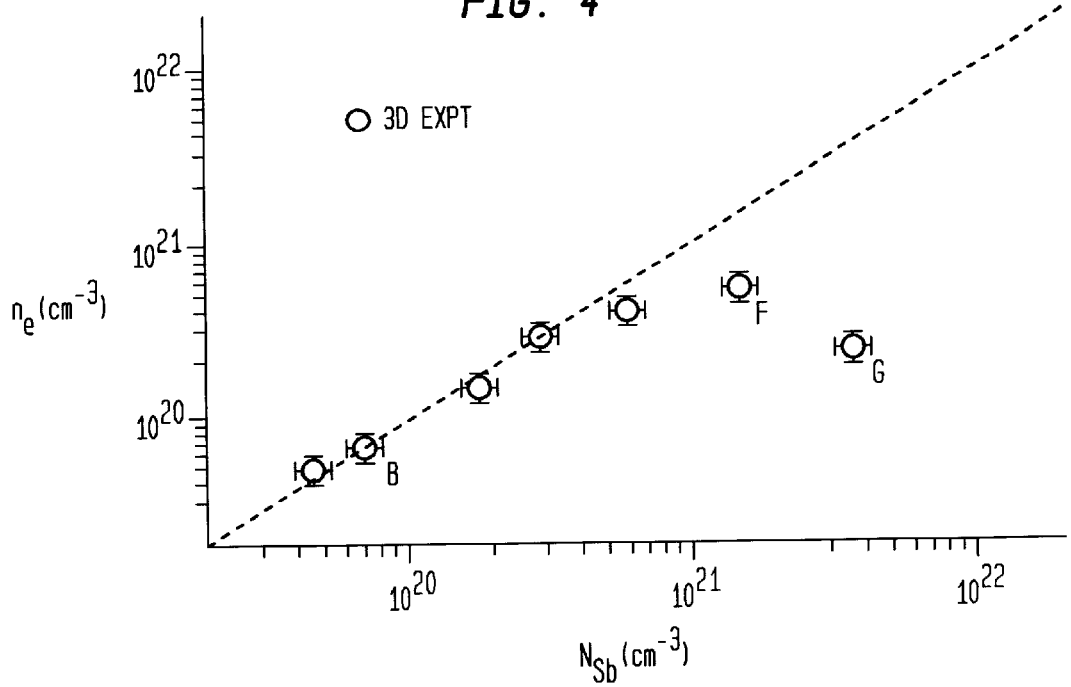
FIGS. 4 & 5 are graphs of free-carrier concentration $n_e$ vs. Sb dopant concentration in (100)-Si samples to compare the saturation effect in about 300 A-thick Sb-doped 3D layers (FIG. 4) with the lack thereof in δ-doped 2D layers (FIG. 5). The sample labels are used for reference, and the dashed line indicates unity activation.

In atomic spectroscopy, the $M_{4,5}$ and $L_3$ symbols used above are standard notations that designate, respectively, excitations from the 3*d* and 2*p* electrons. On the other hand, the term edge refers to a step-like decrease in the intensity of the electrons transmitted through the sample at a specific energy loss. This energy loss occurs when some of the electrons are absorbed by the sample; i.e., in the $M_{4,5}$ case, when a 3*d* electron is excited to an unoccupied state with p- or f-like symmetry, and in the $L_3$ case, when a 2*p* electron is excited to an unoccupied state with s- or d-like symmetry.

In the interest of clarity and simplicity, FIGS. 1–3 have not been drawn to scale. In addition, when describing physical or optical dimensions, the symbol A stands for Angstroms, whereas when describing electric current, it stands for Amperes. In addition, the abbreviations EXPT in FIGS. 4 & 5 and expt in FIG. 8 both mean experimental.

DETAILED DESCRIPTION OF THE INVENTION

With reference now to FIG. 1, a semiconductor device comprises a single crystal Si body 12 and a 2D layer 14 that is δ-doped with a Group V dopant such as P, As or Sb so as to have a free-carrier concentration in excess of about $7 \times 10^{20}$ cm$^{-3}$ and preferably at least $2 \times 10^{21}$ cm$^{-3}$. The body 12 may be a single crystal substrate or it may comprise such a substrate with one or more epitaxial layers grown thereon. Moreover, the device 10 may be a discrete device or it may be part of an integrated circuit. In accordance with one embodiment of our invention, as shown in FIG. 2, the device 10 is a FET 20 that comprises a substrate 22, a gate stack 26 formed on the substrate, dielectric spacers 28 formed on the sides of the gate stack, and source/drain regions 29 formed in the substrate between the spacers 28 and field oxide regions 27. A δ-doped layer in accordance with our invention may be incorporated into one or more of the following sites of the FET: under each spacer 28 as a 2D layer 24*a*, near the top of the source/drain regions 29 (under the source/drain contacts, not shown) as a 2D layer 24*b*, or near the top of the gate stack 26 (under the gate electrode, not shown) as a 2D layer 24*c*. In the case of the source/drain region and the gate stack, it is preferred that a thin Si layer be maintained between the contact and the δ-doped layer.

Figure 8:
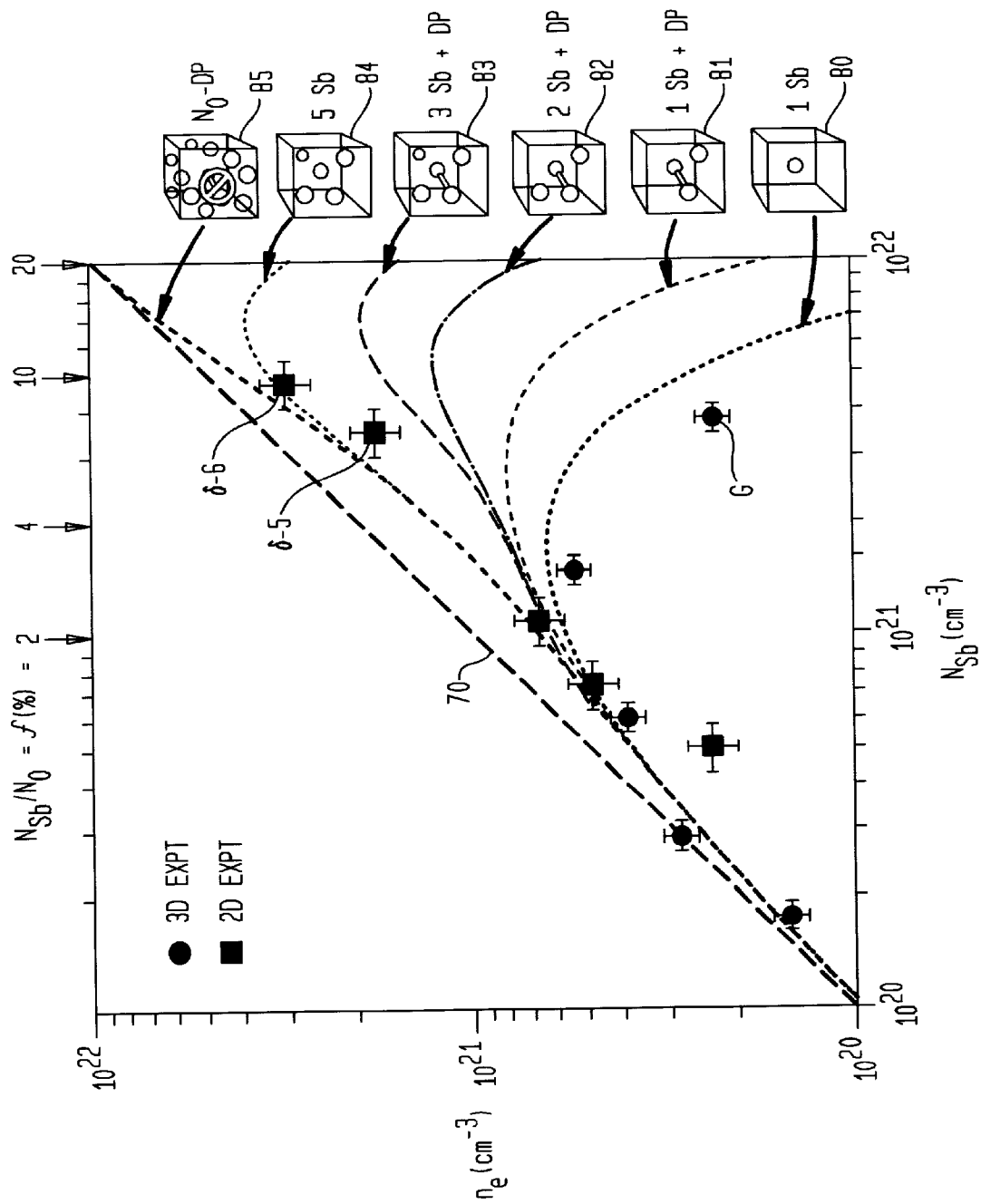
FIG. 8. is a graph showing the free-carrier density $n_e$ vs. Sb dopant concentration in which the δ-doped layer thicknesses, measured using the apparatus of FIG. 3, were used to convert the FIG. 5 areal data to effective volume concentrations. This figure directly compares the experimental free carrier densities in 2D Sb-doped Si samples with 3D conventionally-doped Si samples. The differences in electrical behavior agree well with predictions of a simple model for creating dopant DP centers, shown schematically adjacent the ordinate of the graph as dumbbells, within Si-lattice volumes that are shown schematically as cells 80–85. Line 70 represents unity activation. (Each $n_e$ vs. $N_{Sb}$ curve corresponds to one of these cells as shown by the arrows.) In the interests of simplicity, the cells are depicted as cubes; in reality the cell shape is a more complex three-dimensional polygon. The negation symbol over cell 85 means that DPs are not allowed in the case of very high donor concentrations in the δ-doped layer.

In order to produce doped layers in Si with such high free-carrier concentrations it is important that the processing steps used to fabricate the device or IC form neither a significant amount of electrically inactive precipitates nor a significant number of deactivating dopant centers containing vacancies, and the layer is fabricated as a δ-doped layer that is doped with a Group V element so that the free-carrier density in the layer is in excess of about $7 \times 10^{20}$ cm$^{-3}$, preferably in excess of about $2 \times 10^{21}$ cm$^{-3}$. For example, high annealing temperatures for long enough of times (e.g., 900° C. for 30 min.) may form inactive precipitates and/or deactivating centers containing dopants and vacancies. But we have found that even if care is taken to reduce/avoid both of these kinds of defects, doped Si will still exhibit saturation at sufficiently high dopant concentrations. Thus, as shown in FIG. 8 for the case of Sb-doped Si, at dopant concentrations $N_{Sb}$ above about $1.5 \times 10^{20}$ cm$^{-3}$, the free-carrier concentration $n_e$ begins to roll over (i.e., saturate). Consider, for example, the data point labeled G: at a dopant concentration of about $4 \times 10^{20}$ cm$^{-3}$, a conventionally-doped 3D layer exhibited a free-carrier concentration of only about $2 \times 10^{20}$ cm$^{-3}$. In contrast, when the doped layer is fabricated not only to avoid/reduce precipitates and vacancies but also to reduce donor pairs (DP), the free-carrier concentration is dramatically increased. DP defects are reduced by fabricating the doped layer as a δ-doped 2D layer rather than as a conventionally-doped 3D layer. Compare, for example, the data point labeled δ-5 in FIG. 8: a 2D layer δ-doped with Sb to a concentration of about $4 \times 10^{20}$ cm$^{-3}$ (essentially the same as $N_{Sb}$ for the sample corresponding to data point G) exhibited a free-carrier concentration of about $2 \times 10^{21}$ cm$^{-3}$ (approximately an order of magnitude greater than $n_e$ for the sample corresponding to data point G). Similarly, the data point labeled δ-6 in FIG. 8 corresponds to a 16 A—thick, 2D layer that was δ-doped with Sb to a concentration of about $4.8 \times 10^{21}$ cm$^{-3}$ and had a free-carrier concentration of about $3.1 \times 10^{21}$ cm$^{-3}$.

Thickness Measurement Technique

Before discussing our experimental results, we will describe the technique we used to measure the thickness of extremely thin δ-doped layers, a technique that, to the best of our knowledge, has not been applied to this type of measurement heretofore.

In general, our technique involves spatially resolved electron energy loss spectroscopy (EELS) in a field emission scanning transmission electron microscope (STEM). FIG. 3 schematically shows the apparatus 30 used to practice the technique. An electron beam 34 generated by a STEM (not shown) is focused down to a small (e.g., 2–3 A) spot and scanned across a sample 32. The latter includes a δ-doped layer 36 whose thickness is to be measured. For simplicity layer 36 is depicted as containing a single plane of atoms 37, but in practice may include more than one such plane depending on its thickness and the size of the atoms. To do so, the sample is oriented so that the normal to layer 36 is perpendicular to the direction of the beam 34; i.e., the layer itself is oriented parallel to the beam.

The electron beam 34 is sufficiently narrow that, in each position of the scanned beam, it addresses only a single line of atoms, as depicted by the cylinder 38 shown in phantom. Some of the electrons in the beam are scattered by the addressed atoms as shown by electron beam 44 (elastically scattered electrons) and electron beam 46 (inelastically scattered electrons). These beams are detected in two different ways: beam 44 is detected by an annular dark field (ADF) detector 48 to produce an image of the type shown in the upper half of FIG. 5, whereas the bright line corresponds to the δ-doped layer 36. In contrast, beam 46 passes through the annulus and is incident on EELS spectrometer 50. A bending magnet in the spectrometer disperses the electrons as a function of their energy loss and makes them incident on the parallel detectors 52.

Figure 7:
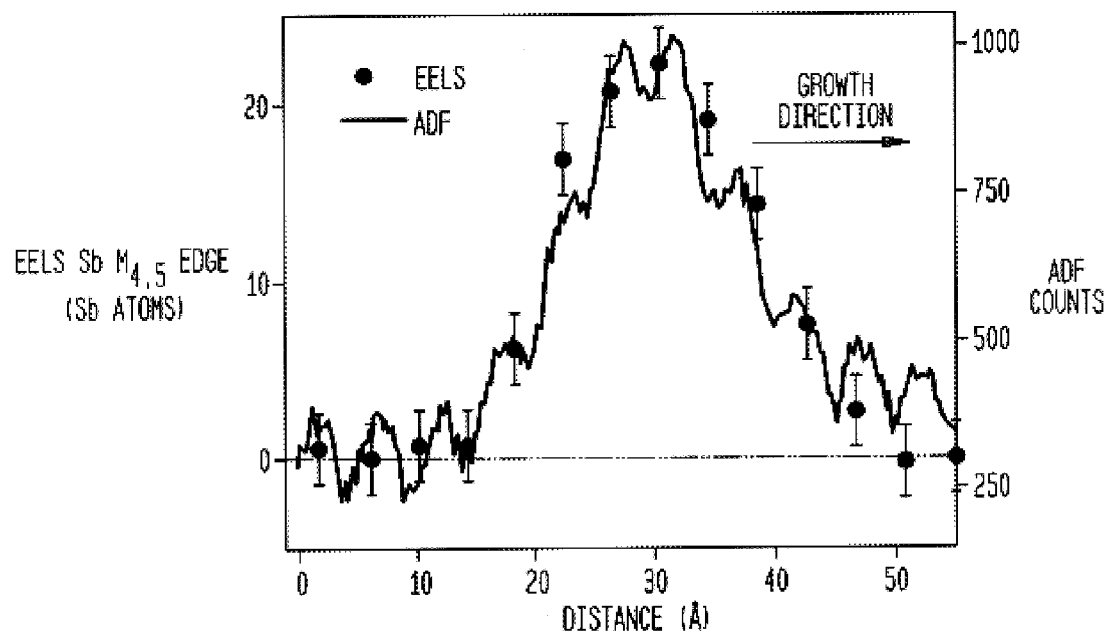

Each element has a unique energy loss spectrum; e.g., Sb atoms 37 in the δ-doped layer 36 have an edge at 500 eV, whereas Si atoms 33 in the sample 32 have an L-edge at 100 eV and a K-edge at 1800 eV. These energy losses are detected by detectors 52, and the corresponding data are recorded in the form of graph 60. An actual EELS signal is plotted in FIG. 7. It shows an integral of a multiplicity of graphs 60 (for the $M_{4,5}$ edge) measured at about 15 different locations across the thickness of the δ-doped layer 36.

EXAMPLE

The following examples describe experiments performed on single crystal Si bodies that included a thin 2D layer δ-doped with Sb in accordance with one embodiment of our invention. Various materials, dimensions and operating conditions are provided by way of illustration only, and, unless otherwise expressly stated, are not intended to limit the scope of the invention.

We used the STEM apparatus and technique described above to directly measure the thicknesses of δ-doped layers from samples whose electrical properties had priorly been well determined. This approach allowed us to convert 2D dopant areal concentrations and free-carrier areal densities to corresponding volumetric numbers in 3D, for purpose of comparison. Surprisingly, and contrary to conventional wisdom regarding the formation of DP defects, we found that electrical saturation in highly doped (δ-doped) 2D Si layers did not occur. Extended x-ray absorption fine structure (EXAFS) measurements confirmed that in these samples neither precipitates nor vacancy-containing dopant defects played a significant role.

From a theoretical standpoint, the results can be explained using a simple model in which the formation of DP defects is frustrated at high dopant concentrations in δ-doped layers, thus inhibiting saturation behavior. This model thus predicts that in 2D δ-doped Si it should be possible to realize almost complete electrical activity even at very high levels of n-type doping.

Figure 5:
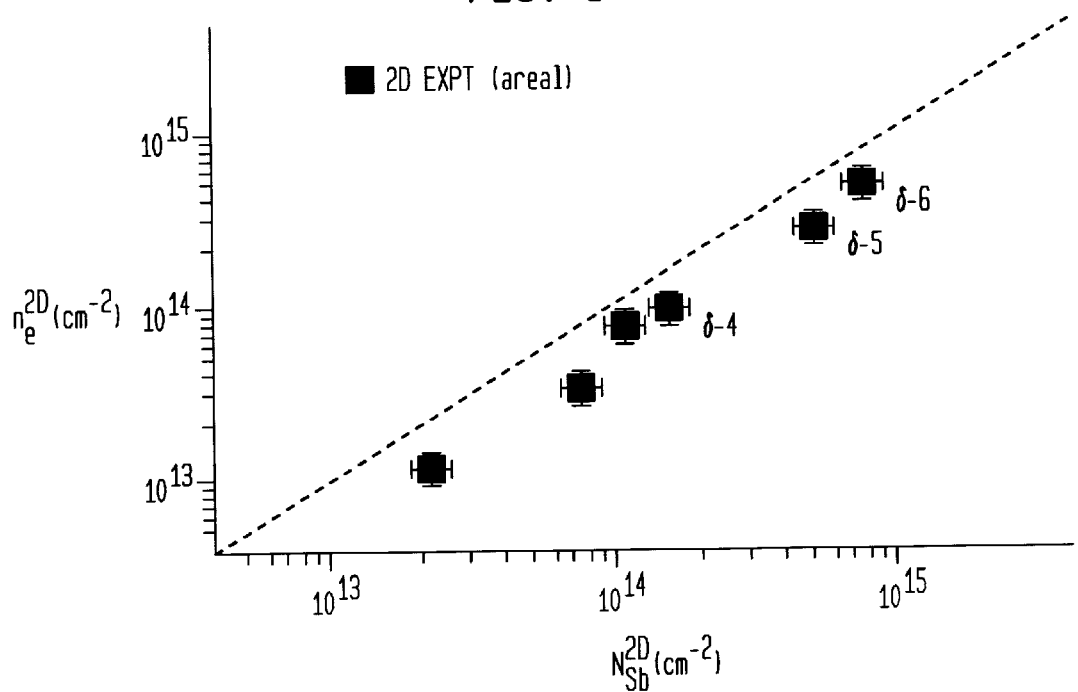

To illustrate the basic problem of characterizing dopant activity in 2D layers, we first show in FIG. 4 an example of electrical saturation for the case of 3D Sb-doped Si. The samples were grown by low-temperature MBE with the Sb atoms distributed over a 300 A wide region. Dopant atoms were confined to a much narrower region (e.g., 10–20 A) in the 2D δ-doped samples grown under conditions similar to those used to form the 3D layers; their dopant and free-carrier concentrations are plotted in FIG. 5 in areal rather than volume dimensions. FIGS. 4 & 5 span the same change in concentration of $10^3$, but the electrical activity ($n_e/N_{Sb}$) in the 3D and 2D samples exhibits qualitatively very different behavior. Understanding the difference in electrical behavior clearly requires knowing the effective volume concentrations of dopants in the 2D samples, which in turn means that the width (thickness) of the layers, especially the thinner δ-doped layers, should be measured with a relatively high degree of precision (e.g., better than±3 A, the spacing between atoms).

As explained above, we used the STEM & EELS apparatus of FIG. 3 to determine spatial distributions of the δ-doped layers. The Sb atoms in those layers were probed at internal interfaces by passing a focused, 2–3 A diameter, 100 keV electron beam through the sample. The sample was made to be thick enough to avoid significant surface state contributions to the transmitted signal, yet thin enough to avoid significant beam spread from multiple scattering. The interface (e.g., layer 36 of FIG. 3) was oriented parallel to the electron beam to allow columns of atoms within the interface to be measured separately from atoms in adjacent columns. Because the interface was viewed in projection, any interfacial roughness, particularly on length scales thinner than the sample, lead to an apparent broadening of the interface. Accordingly, the widths of the δ-doped layers quoted herein are upper-limit values.

To map out the spatial distribution of the Sb $M_{4,5}$ edge, which is sensitive only to the chemical composition of the sample, the δ-doped layer was located using images from the stronger ADF signal, which is sensitive to both chemical composition and localized strain fields. The ADF signal arose from the electrons that had undergone elastic, Rutherford-like scattering to relatively large angles (beam 44 of FIG. 3), resulting in an intensity roughly proportional to the square of the atomic number in the thin samples. Measurements were performed on an STEM equipped with a cold field-emission gun and a McMullan-style parallel EELS spectrometer. Cross-sectioned samples were polished to electron transparency; i.e., thin enough to allow electrons to pass therethrough (e.g., less than about 2000 A and preferably about 300–500 A). Then the samples were briefly ion milled and dipped in HF to remove the damaged surface layer. EELS spectra were recorded simultaneously with the ADF signal under conditions optimized for atomic resolution the Sb $M_{4,5}$ edge of 2.7 A.

Figure 6:
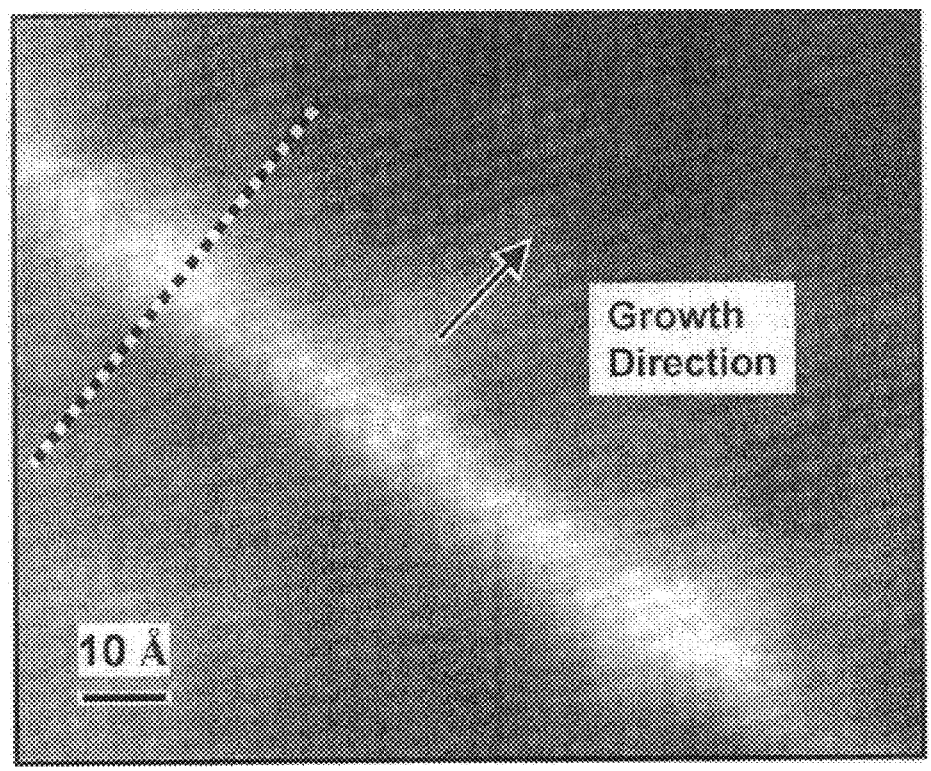
FIGS. 6 & 7 are used to describe our technique for measuring the thickness of 2D δ-doped layers.

FIG. 6 shows the ADF image for the 2D δ-doped sample labeled δ-5 in FIG. 5. The corresponding intensity profile (composition plus strain) shown in FIG. 7 closely matches the superimposed EELS intensity profile (composition) measured across one of the broadest parts of the δ-doped layer as shown by the checkered line of FIG. 6. The full-width-at-half-maximum (FWHM) of the δ-doped layer varied between 10 A and 20 A with mean value of 17 A over a 50 A long region. Examining many such images gave us an average FWHM value of 16 A with a standard deviation of 1 A (i.e., about 15–17 A). Comparable mean values were measured for the other 2D δ-doped samples. In general, however, a δ-doped layer thickness of less than about 25 A is suitable for use in our invention.

The measured δ-doped layer widths allowed us to convert the 2D dopant and free-carrier areal densities in FIGS. 4 & 5 to effective volume concentrations. The data so converted (solid squares) is shown in FIG. 8, whereas the 3D conventionally-doped data (open circles) are included to provide a basis for direct comparison. The data show that the 2D sample δ-5 and the 3D sample G have essentially identical dopant concentrations of about $4\times10^{21}$ cm$^{-3}$, the highest concentration among all of the samples (except for δ-6). Yet, the free-carrier concentration of the 2D δ-doped sample is about $2\times10^{21}$ cm$^{-3}$, nearly an order of magnitude higher than that of the 3D sample.

Figure 9:
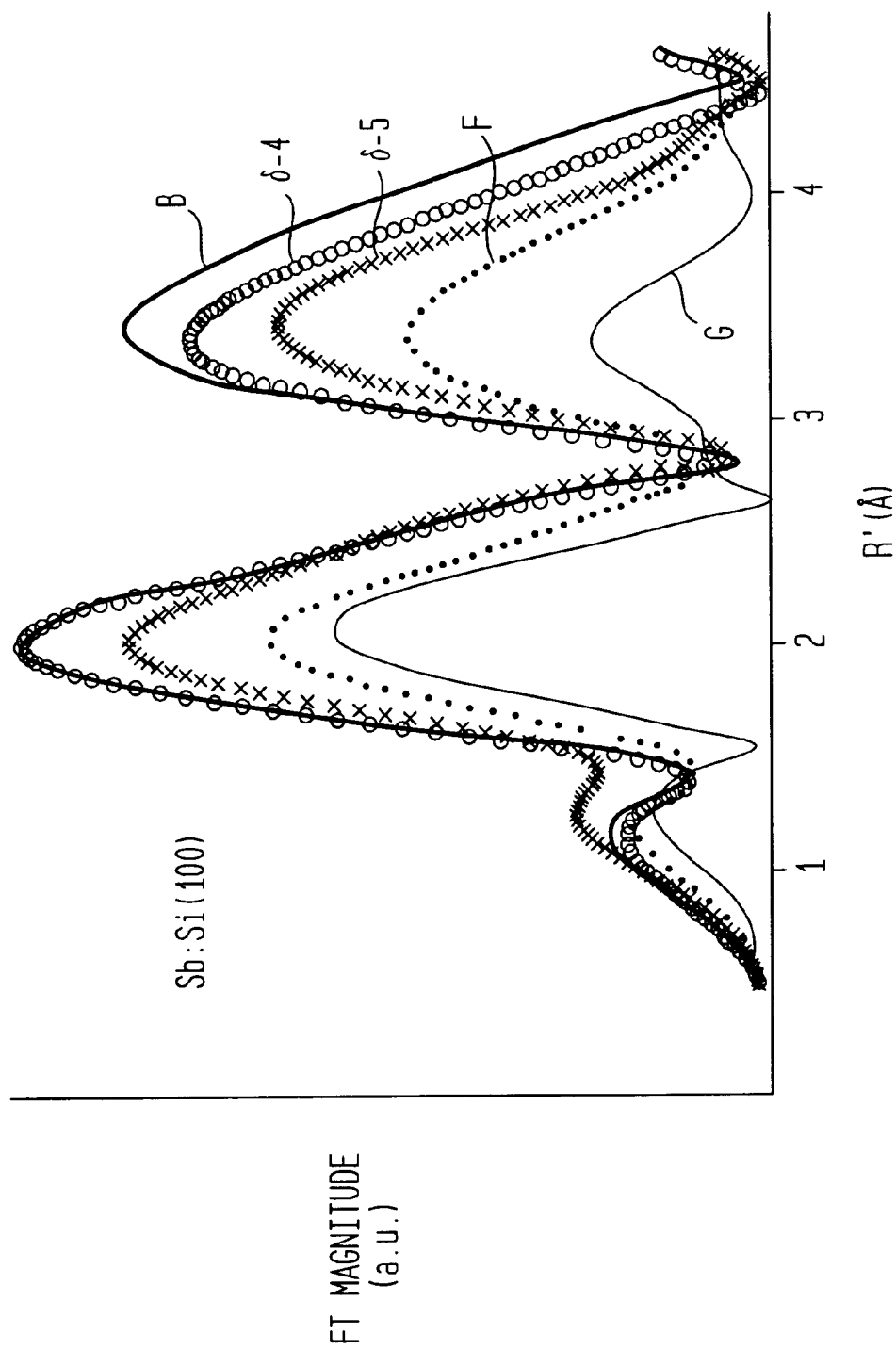
FIG. 9 is a graph of Fourier transformed Sb $L_3$-edge EXAFS data on the local structure around Sb from the multiplicity of 2D and 3D samples of FIGS. 3 & 4. The volume concentrations of Sb in the δ-5 sample and the G sample are almost identical. R' is related to the distance between Si and Sb atoms (uncorrected for phase shift).

Further confirmation of this striking difference in electrical activity is found in our study of the local structure around Sb atoms from a series of 2D and 3D samples using Sb $L_3$-edge EXAFS measurements. Fluorescence-detection x-ray absorption measurements from samples cooled to <50° K. (to reduce the effects of thermal disorder). The Fourier transformed (FT) EXAFS data are shown in FIG. 9 for the most highly doped 2D and 3D samples, δ-5 and G, respectively. Also included for reference is a relatively low concentration 3D sample, labeled B, containing Sb in only substitutional sites. In sample B the FT peak at about 2 A (uncorrected for phase shifts) corresponds exclusively to first-neighbor Si atoms around Sb atoms, whereas the peak at about 3.4 A contains unresolved second and third-neighbor Si atoms. Any surrounding atoms not at these distances, or any Sb neighbors within about 4 A, will lead to destructively interfering EXAFS and a reduction of the FT-peak magnitudes. This effect is observed in both main peaks in the 3D-doped samples. There is also evidence in sample G of forming a Sb—Sb FT peak at about 2.9 A, signaling the early stages of Sb clustering. In contrast, the 2D δ-doped samples show much less reduction in the FT peak intensities and no indication of Sb clustering. These results, therefore, demonstrate that even in δ-doped layers with high dopant concentrations, the Sb atoms still occupy predominantly substitutional Si sites, consistent with the high electrical activity displayed in FIG. 8.

Theory

Why do similarly high concentrations of n-type dopants in Si—differing only in their dimensionality—exhibit such different electrical behavior? The previous work of Chadi et al, supra, showed that the dominant mechanism for deactivating free carriers in n-doped Si is the formation of DP defects, provided that two conditions are avoided in sample preparation; i.e., the formation of inactive precipitates and other deactivation centers (e.g., the $d_m V_n$ centers described by Chadi et al., supra) is minimal. The samples described herein all satisfied these conditions. In addition, the doping levels, and thus the number and energy of free carriers at the Fermi level, should be high enough to create DP defects. This condition was also satisfied in those samples herein where $n_e > 1-3 \times 10^{20}$ cm$^{-3}$, corresponding to the energy range $E_F \approx 0.07-0.15$ eV needed to create the two lowest-energy DP defects. The formation of these two defects, denoted DP(2) and DP(4) because each contains a pair of substitutional donor atoms separated by second-neighbor or fourth-neighbor distances, involves significant deformation of the surrounding Si lattice. It is, therefore, appropriate to look for a relationship between the concentration and dimensionality of donor atoms and the ability of the Si lattice to deform and create these defects.

Consider the consequences of randomly distributing $N_d$ dopant atoms in 3D among the $N_o$ substitutional sites in Si($N_o = 5 \times 10^{22}$ cm$^{-3}$). Any given dopant atom is surrounded by 28 sites, the occupation of which by a second dopant atom can lead to both dopant atoms becoming electrically inactive; viz., there are 4 first neighbor sites giving dimers and 24 other sites giving DP(2) and DP(4) defects. The total probability for all configurations in which other dopants occupy any of these 28 special sites can be expressed in terms of the fractional dopant population, $f = N_d/N_o$, by the following equation:

$$1 = [f + (1-f)]^{28} = (1-f)^{28} + 28f(1-f)^{27} + (28 \times 27/2!)f^\alpha (1-f)^{26} + \quad (1)$$

The first term in the expansion of equation (1) represents the probability that no other dopant atoms will occupy any of the 28 special sites around a given dopant atom; the second term represents the probability that only one other dopant will occupy one of those sites, etc. The contribution to the total free-carrier concentration (absent any DP defects) is then obtained by multiplying each term by $N_d$. Previous work (e.g., Chadi et al., supra) on 3D-doped Si considered only the effect of the first term on electrical activity because it dominates when $f$ is small; i.e., $f \leq 1/29$, or about 3.5%. However, when $f$ is no longer small, not only must the higher-order terms in equation (1) be considered, but so must the competing interactions between dopants, defects and the Si lattice.

A simple way to see what happens as $f$ increases is to picture $N_d$ dilute dopant atoms with each one lying at the center of its own 3D Si-lattice volume (or cell 80, FIG. 8), containing the 28 special sites, giving a total of 29 relevant sites per cell per dopant atom. (To simply our discussion we ignore dimers.) As $f > 1/29$, the probability increases for a second dopant atom to occupy this cell and form a DP defect, leading always to no free carriers from either dopant atom. (Thus, no cube depicting this case is shown in FIG. 8.) Increasing $f$ still further makes it likely that three dopant atoms can occupy a cell 81, but now there are (at least) two possibilities to create one DP defect, leaving one dopant atom still active. The number of free carriers in this case is represented by multiplying the third term in equation (1) by ⅓. Four dopants per cell 82 leading to one DP defect is represented by multiplying the fourth term by ½, etc. The electrical activities corresponding to configurations with up to 1, 3, 4 or 5 dopant atoms per cell and at most 1 DP defect are depicted as cells 80–84 (and curves 80–84) in FIG. 8 adjacent the ordinate, where the DP defects are shown schematically as dumbbells, and the Si cells are shown schematically as cubes with sides $\leq 2 \, (2)^{0.5} a_o$ or less than about 15 A, to encompass the DP(4) defects, where $a_o$ is the lattice constant (5.43 A in Si). The increase in electrical activity with dopant density as each of the higher order terms in equation (1) is included is apparent from the progression of $n_e$ vs. $N_{Sb}$ curves 80–85 toward the asymptote (unity activation line 70).

The calculated electrical activities in FIG. 8 reflect the statistics of occupying particular sites, not of actually forming defects. Increasing the density of dopant also means decreasing the density of ancillary Si atoms needed to create the DP defects through the deformation of the surrounding lattice, a factor not included in equation (1). Consequently, there must be a threshold in $f$ below which DP defect creation is favored and above which it is inhibited. When $f$ is above threshold in 3D-doped Si, precipitates offer an alternative to DP defects because their formation requires comparatively less Si deformation. An example of this is seen in sample G. However, above threshold in 2D δ-doped Si, forming DP defects or precipitates is inhibited still further because the choice between which dopant atoms pair up and the ability of the lattice to deform are both constrained by the narrowness of the δ-doped layer, which we directly measured here (in an upper limit) to be comparable to a single 3D cell width (typically less than about 15 A). In other words, active dopant atoms in 2D lying anywhere other than at the center of their cells have fewer options/degrees of freedom than such dopants in 3D because the number of shared cell faces across which the 2D dopant atoms can form DP defects or precipitates is reduced. Therefore, high concentrations of 2D dopants are more likely to remain electrically active because they are, in effect, geometrically frustrated.

The electrical activity from frustrated dopant atoms has been represented in FIG. 8 by including two additional configurations. One is a cell 84 with up to 5 dopant atoms and no DP defect; i.e., the sum of the 1$^{st}$, 3$^{rd}$, 4$^{th}$ and 5$^{th}$ terms of equation (1) and no corresponding multipliers of ⅓, ½ and ⅗; the other is the asymptotic limit of a cell (85) with up to $N_o$ dopant atoms and no DP defect; i.e., all terms of equation (1) but the second. (In the legend, "$N_o$—DP" indicates the absence of any DP defect.) The predicted electrical activity for either configuration is seen to be in very good agreement with that measured for the 2D δ-doped sample with highest dopant concentrations (i.e., samples δ-5 and δ-6). Indeed, the trend towards obtaining even higher free-carrier densities from frustrated dopants is very encouraging.

In conclusion, we have demonstrated a simple, yet very surprising result: geometrically constraining high concentrations of Sb dopants in 2D can strongly inhibit the formation of inactive or deactivating defects in Si, thereby surpassing the barrier to achieving full electrical activity. This discovery should also apply to high doping levels of DP-defect-forming P and As dopants, with the understanding that the degree to which electrical deactivation will be inhibited depends on how narrow the δ-doped widths can be fabricated.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A method of fabricating an integrated circuit comprising the steps of providing a single crystal silicon body, forming a doped layer in said body, characterized in that said method includes fabricating said circuit using process steps that form neither a significant amount of precipitates nor a significant number of vacancies and fabricating said layer as a δ-doped layer that is doped with a Group V element, so that the free-carrier density in said layer is in excess of about $7 \times 10^{20}$ cm$^{-3}$.

2. The invention of claim 1 wherein said δ-doped layer is fabricated to have a thickness of less than about 25 A.

3. The invention of claim 1 wherein said dopant is selected from the group consisting of P, As and Sb.

4. The invention of claim 3 wherein said dopant is Sb.

5. The invention of claim 4 wherein the free-carrier density of Sb in said layer is at least about $2 \times 10^{<2}$ cm$^{-3}$.

* * * * *